(12) United States Patent
Fiolka (10) Patent No.: US 8,077,289 B2
(45) Date of Patent: Dec. 13, 2011

(54) DEVICE AND METHOD FOR INFLUENCING THE POLARIZATION DISTRIBUTION IN AN OPTICAL SYSTEM

(75) Inventor: Damian Fiolka, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 626 days.

(21) Appl. No.: 12/052,507

(22) Filed: Mar. 20, 2008

(65) Prior Publication Data

US 2008/0218725 A1  Sep. 11, 2008

Related U.S. Application Data

(63) Continuation of application No. PCT/EP2006/066749, filed on Sep. 26, 2006.

(60) Provisional application No. 60/723,362, filed on Oct. 4, 2005.

(51) Int. Cl.
*G03B 27/54* (2006.01)
(52) U.S. Cl. ............................................. 355/67; 355/53
(58) Field of Classification Search .................... 355/53, 355/67; 359/486.01–486.03, 488.01
See application file for complete search history.

(56) References Cited

U.S. PATENT DOCUMENTS

| 6,252,712 | B1 | 6/2001 | Furter et al. | |
|---|---|---|---|---|
| 7,245,353 | B2 | 7/2007 | Mulkens et al. | |
| 2002/0126380 | A1* | 9/2002 | Schuster | 359/485 |
| 2002/0176166 | A1* | 11/2002 | Schuster | 359/494 |
| 2005/0146704 | A1 | 7/2005 | Gruner et al. | |
| 2005/0195480 | A1 | 9/2005 | Brown et al. | |
| 2005/0270513 | A1* | 12/2005 | Dierichs et al. | 355/67 |
| 2006/0077370 | A1* | 4/2006 | Mulkens et al. | 355/67 |
| 2007/0081114 | A1 | 4/2007 | Fiolka et al. | |
| 2007/0146676 | A1 | 6/2007 | Tanitsu et al. | |
| 2008/0043236 | A1 | 2/2008 | Kaise et al. | |

FOREIGN PATENT DOCUMENTS

| EP | 1 653 282 | 5/2006 |
|---|---|---|
| EP | 1 726 994 | 11/2006 |
| EP | 1 840 945 | 10/2007 |
| EP | 1 668 420 B1 | 5/2008 |
| JP | 11-271680 A | 10/1999 |
| JP | 2000-082655 A | 3/2000 |
| JP | 2005-166871 A | 6/2005 |
| JP | 2006-114904 A | 4/2006 |
| JP | 2007-515768 A | 6/2007 |
| JP | 2007-527549 A | 9/2007 |
| JP | 4582096 | 11/2010 |
| JP | 2011-003908 | 1/2011 |

(Continued)

OTHER PUBLICATIONS

EP Office Action and Translation for corresponding EP Application No. 06793831.6, dated Aug. 23, 2010.
The Japanese Office Action, with English translation, for corresponding JP Appl. No. 2008-533973, dated Sep. 1, 2011.

*Primary Examiner* — Edward Glick
*Assistant Examiner* — Mesfin T Asfaw
(74) *Attorney, Agent, or Firm* — Fish & Richardson P.C.

(57) ABSTRACT

The disclosure relates to a device and a method for influencing the polarization distribution in an optical system, in particular in a microlithographic projection exposure apparatus. A device according to the disclosure includes a plurality of polarization-influencing optical elements which are arranged in a common plane in such a way that they can be moved independently of each other.

30 Claims, 4 Drawing Sheets

FOREIGN PATENT DOCUMENTS

| WO | WO 03/077011 | 9/2003 |
| WO | WO 2005/040927 | 5/2005 |
| WO | WO 2005/069081 | 7/2005 |
| WO | WO 2006/016584 | 2/2006 |
| WO | WO 2006/077846 | 7/2006 |
| WO | WO 2006/077849 | 7/2006 |

* cited by examiner

DEVICE AND METHOD FOR INFLUENCING THE POLARIZATION DISTRIBUTION IN AN OPTICAL SYSTEM

CROSS-REFERENCE TO RELATED APPLICATIONS

The present application is a continuation of PCT/EP2006/066749, filed Sep. 26, 2006, which claims benefit of U.S. Ser. No. 60/723,362, filed Oct. 4, 2005. The contents of PCT/EP2006/066749 are hereby incorporated by reference.

FIELD

The disclosure relates to a device and a method for influencing the polarization distribution in an optical system, in particular in a microlithographic projection exposure apparatus.

BACKGROUND

Microlithographic projection exposure apparatuses are used for the manufacture of microstructured components such as for example integrated circuits or liquid crystal displays (LCDs). A projection exposure apparatus of this kind includes an illumination system and a projection objective. In the microlithography process, an image of a mask (commonly referred to as a reticle) that is illuminated via the illumination system is projected via the projection objective onto a substrate (for example a silicon wafer) which is coated with a light-sensitive coating layer (photoresist) and is arranged in the image plane of the projection objective, whereby the mask structure is transferred to the light-sensitive coating of the substrate.

As is known, the image contrast in the microlithography process can be significantly improved if the mask is illuminated with linearly polarized light, wherein it is of advantage if the preferred direction of the linear polarization is parallel to the lengthwise direction of the grid structures that are present on the mask. In the illumination with polarized light, it is also desirable that the polarization distribution be as constant as possible over the entire reticle field in order to achieve a constant image contrast and thus a defect-free image of the grid structures. However, a problem is encountered here in that the light falling on the mask has previously traveled over different ray paths in the illumination system, where an originally existing polarization distribution (of light that was generally of linear polarization when it entered the illumination system) has been changed to different degrees on the different ray paths by polarization-influencing effects (e.g., by stress-induced birefringence caused by components of mounting devices in the material of the optical components such as lenses, or by polarization-influencing effects of dielectric layers, etc.).

SUMMARY

In some embodiments, the disclosure provides a device and a method for influencing the polarization distribution in an optical system, in particular in a microlithographic projection exposure apparatus, wherein the device as well as the method provide the capability of an adjustment whereby the polarization distribution in a specified plane can be made constant to a high extent.

In certain embodiments, the device includes a plurality of polarization-influencing optical elements which are arranged with mutually independent mobility in a common plane.

In one aspect, the disclosure features a device that includes a plurality of optical elements are arranged in a common plane and so that they can be moved independently of each other. Each of the optical elements is capable of converting a state of polarization of incoming light on the optical element into another state of polarization. The device is configured to be capable of influencing a polarization distribution in a microlithographic projection exposure apparatus when the device is used in the microlithographic projection exposure apparatus.

In another aspect, the disclosure features a microlithographic projection exposure apparatus that includes a projection objective configured to project an image of an object field into an image field in an area that is movable in a first direction relative to the projection objective. The microlithographic projection exposure apparatus also includes a device as described in the preceding paragraph.

In a further aspect, the disclosure features a method that includes determining a polarization distribution of light in a plane of a projection exposure apparatus. The method also includes arranging a device as described herein, and moving at least one of the optical elements of the device in order to achieve an altered polarization distribution of the light In particular in a projection exposure apparatus, the individual polarization-influencing elements due to their independent mobility can be advanced by different degrees independently of each other into the illuminated area in which the polarization distribution is to be influenced (for example into a plane near the reticle plane), so that an effect of a change of the preferred direction of the polarization caused by the individual polarization-influencing elements can be specifically adjusted in regard to how much of the aforementioned plane is covered by each of the elements.

The term "polarization-influencing element" in the sense of the present disclosure includes any optical element that has the property of converting a state of polarization of incoming light which falls on this optical element into another state of polarization, be it by rotating the preferred direction of the polarization of the incoming light, by filtering out the light component of a certain state of polarization in the sense of a polarization filter, or by converting a first state of polarization into a second state of polarization (for example a conversion of linearly polarized light into circularly polarized light). Although this change of the state of polarization according to the disclosure occurs desirably for light that passes through the polarization-influencing element, i.e. for transmitted light, the disclosure is not limited to transmission. A change of the state of polarization of light which falls on the optical element can in principle also take place as a result of reflection or absorption of the light component of a specific state of polarization.

In some embodiments, at least one, but optionally all, of the polarization-influencing optical elements cause a rotation of the preferred direction of polarization. Converting the state of polarization by way of a rotation is advantageous because it occurs almost without loss of light, so that when influencing the polarization distribution in accordance with the disclosure, the problem of thereby simultaneously causing a change in the intensity distribution can be avoided.

In certain embodiments, the polarization-influencing optical elements are individually movable independently of each other in a common direction of displacement. Particularly if the displacement direction is parallel or approximately parallel to the scanning direction in the projection exposure apparatus, the individual independent mobility allows a controlled manipulation as to how far a desired state of polarization is obtained for the position of the respective element in the direction perpendicular to the scan direction by averaging over the scan direction. It can be advantageous to set the elements at a slightly oblique angle, in particular at an angle between 2° and 30° relative to the scanning direction for example above the reticle field, because in this case the light losses caused by the borders of the elements will partially average out in the scanning process.

The degree to which a desired state of polarization is realized at a specific location is called "IPS value", as will be explained in the following in more detail, and its average over the scan direction is called "scanned IPS value". The abbreviation IPS stands for "Intensity in Preferred State", and the IPS value indicates the energy ratio between the light intensity in the intended direction of polarization (which can be measured, e.g. with an ideal polarizer whose transmitting direction is set to the intended direction) and the total intensity. By determining these mean values without the device according to the disclosure and by subsequently making selective adjustments in the settings of the individual polarization-influencing elements, it becomes possible in particular to set a profile of the scanned IPS value that is substantially constant over the field in the direction perpendicular to the scanning direction, namely by selecting the displacement position for each of the elements in such a way that the result of the correction equals the minimum of the scanned IPS values that is obtained when no correction is made by the device according to the disclosure.

In some embodiments, the polarization-influencing optical elements are arranged in such a way that they can be moved independently of each other in displacement directions that are oriented radially relative to a common axis.

A device of this kind is suitable for example to manipulate the state of polarization locally in a pupil plane, if the device is arranged at least in the proximity of the pupil plane. To realize this concept, the device can be arranged in such a way that the aforementioned axis in relation to which the radial displacement direction of the individual polarization-influencing elements is defined, coincides with the optical axis of the illumination system. To achieve a local manipulation of the state of polarization, the individual elements can be moved by different degrees more or less far into the pupil. Particularly in conjunction with a dipole illumination, a quadrupole illumination, or an annular (ring-shaped) illumination, this allows a specifically targeted manipulation of the state of polarization in individual areas of the respective illumination arrangement, for example one of the four poles of a quadrupole illumination, by an appropriate displacement of one or more of the polarization-influencing elements that are arranged in the area of that pole. In this way it is possible to adjust the state of polarization in certain areas of the pupil to a specifically targeted constant setting. For example, initially different IPS values in the poles of a dipole- or quadrupole illumination can be adjusted so that they are equal. To accomplish this, one or more of the polarization-influencing elements are moved radially into the pupil by an appropriate displacement distance at the pole or poles with the larger IPS values, so that a part of the respective pole is covered up, where the preferred direction of polarization is changed (for example rotated by 90° in certain embodiments), so that a commensurately smaller IPS value is obtained as an average over that pole.

By arranging a device according to the disclosure in an illumination device of a microlithographic projection exposure apparatus and with an appropriate setting of the polarization-influencing elements, it is possible to anticipate and make a correction already in the design in particular also for birefringent influences coming from the reticle itself.

In certain embodiments, if the transmitted light is of a given operating wavelength and of substantially linear polarization, at least one and optionally all of the polarization-influencing optical elements produce a state of polarization substantially orthogonal to the state of polarization before the element. In other words, the element causes a rotation of the preferred direction of polarization by about $90°\pm n*180°$ (wherein n is an integer larger than or equal to zero)

In some embodiments, at least one of the polarization-influencing optical elements is made of an optically active crystal material, wherein the optical crystal axis is substantially parallel to the direction of light propagation. The optically active crystal material can in particular by crystalline quartz, $TeO_2$ of $AgGaS_2$.

In some embodiments, at least one of the polarization-influencing optical elements is made of a birefringent crystal material and can be configured in the form of a $\lambda/2$-plate.

In some embodiments, at least one of the polarization-influencing optical elements is made from a birefringent dielectric layer or a combination of a birefringent dielectric layer and a birefringent crystal material.

In certain embodiments, at least one of the polarization-influencing optical elements has a substrate that is transparent for transmitted light of a given operating wavelength and does not influence the polarization, with a birefringent plate of a birefringent dielectric layer arranged on the substrate, a concept that is advantageous for reasons of mechanical stability and in particular also allows the use of low-order retarding elements of strongly birefringent materials which typically have a thickness of only a few microns.

In some embodiments at least one, but optionally all, of the polarization-influencing optical elements have a thickness which amounts to not more than 15% (e.g., not more than 10%, not more than 5%) of its average width. For a typical width of the polarization-influencing optical elements of 5 millimeters, their thickness can be typically chosen in the order of 0.5 millimeters (mm) or less.

In certain embodiments, at least one, but optionally all, of the polarization-influencing optical elements have peripheral faces that are at least in some parts provided with a layer being absorbent for light of the operating wavelength. For typical operating wavelengths less than 250 nm, in particular 193 nm or 157 nm, e.g. tantalum pentoxide ($Ta_2O_5$) is suitable as an absorbent layer material.

The above-noted embodiments, which may also be combined with each other, can have the advantage that an influence of the peripheral faces (which are connecting the opposing side surfaces, i.e. the light entrance surface and the light exit surface, of the polarization-influencing optical elements with each other and which are, due to their limited aperture at the place of the respective polarization-influencing optical element, also surfaces contributing to the optical imaging) on the illumination performance can be kept low or can be minimized, respectively.

In some embodiments, at least one, but optionally all of the polarization-influencing optical elements are, at least in some parts, provided with an antireflection coating in order to achieve the effect being desired according to the present disclosure as far as possible without loss of light.

According to a further aspect, the disclosure also relates to a microlithographic projection exposure apparatus including:
 a projection objective, which projects an object field in an image field that is arranged in a substrate area, wherein the substrate area is movable relative to the projection objective in a predetermined scanning direction; and at least one device for influencing the polarization distribution with a plurality of polarization-influencing optical elements having the above described features.

In certain embodiments, the plurality of polarization-influencing optical elements are arranged such that after performing a scan integration in the microlithographic exposure process (i.e. after the collecting or integrating, respectively, of all light information, inclusive of the respective polarization states, along the scan direction during the scan movement of the waver in the microlithographic exposure process) a substantially constant polarization distribution results in the direction that is perpendicular to the scan direction. Thereby the scan integration is advantageously used for providing a polarization distribution being, for the projecting process, effectively constant transverse to the scanning direction, so that an undesirable field variation of the "scanned" polarization transverse to the scanning direction can be avoided and a projection of the individual microstructures can be achieved with identical polarization performance.

In some embodiments, the microlithographic projection exposure apparatus further includes a device for influencing the intensity distribution, which at least partially compensates a change of the intensity distribution that is caused by the device for influencing the polarization distribution according to the present disclosure. This device for influencing the intensity distribution can particularly include a plurality of light-blocking elements which can be moved independently of each other in a common plane, which are configured to be at least in some parts partially transmissive or opaque for the light passing therethrough, as described in WO 2005/040927 A2.

Thereby it is possible to consider also a possibly remaining absorbing effect of the polarization-influencing optical elements of the device according to the present disclosure (and an accompanying modification of the scan-integrated intensity), by introducing a suitable correction or re-adjustment of the scan-integrated intensity. Thereby an aimed adjustment of the scan-uniformity can be achieved by setting up, in addition to the scan-integrated polarization, also the scan-integrated intensity.

The appropriate adjustment of the above described device for influencing the intensity distribution and the device for influencing the polarization distribution according to the present disclosure can be performed, with regard to the interrelation between them, also iteratively, e.g. by determining, after appropriately adjusting the partially transmissive or opaque elements of the former device, the polarization distribution once again and readjusting the polarization-influencing optical elements of the latter device, etc.

The afore described device for influencing the intensity distribution can be, like the device for influencing the polarization distribution according to the present disclosure, arranged at least close to a field plane. By way of an example, the device for influencing the intensity distribution may be arranged in an intermediate image plane upstream of a REMA-objective of the illumination device, and the device for influencing the polarization distribution can be arranged in close vicinity to the reticle plane.

The disclosure also relates to a method of influencing the polarization distribution in a microlithographic projection exposure apparatus, wherein the method includes the steps of:
 determining a polarization distribution in a predetermined plane of the projection exposure apparatus;
 arranging at least one device according to the present disclosure in the predetermined plane; and
 moving at least one of the polarization-influencing elements of the device in order to achieve an altered polarization distribution.

In some embodiments, the step of moving at least one of the polarization-influencing elements is performed in such a way that the result is a substantially constant polarization distribution in a given direction or in a given area. In certain embodiments, the step of moving at least one of the polarization-influencing elements is performed in such a way that that after performing a scan-integration in the microlithographic exposure process a substantially constant polarization distribution is obtained in the direction perpendicular to the scan direction.

For embodiments and advantages of the method reference is made to the above embodiments described in the context of the device of the present disclosure or the microlithographic exposure apparatus, respectively.

Further embodiments of the disclosure can be found in the description and in the claims.

The disclosure will hereinafter be explained in more detail with references to examples that are illustrated in the attached drawings.

DETAILED DESCRIPTION

Figure 1:
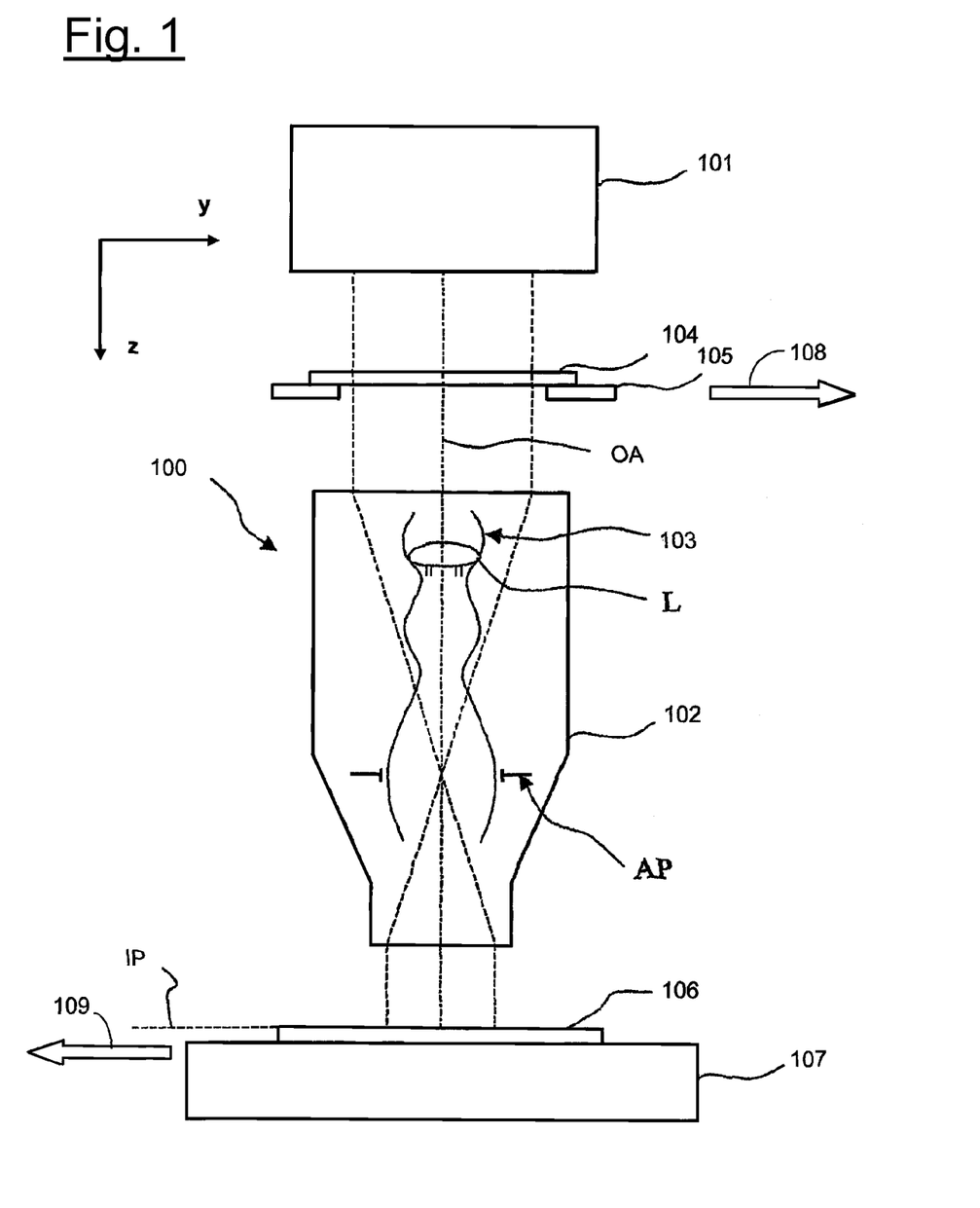
FIG. 1 shows a schematic representation of a design arrangement of a microlithographic projection exposure apparatus.

FIG. 1 schematically represents a typical configuration of a microlithographic projection exposure apparatus 100 in particular of a kind in which a device according to the disclosure can be installed.

According to FIG. 1, the projection exposure apparatus 100 includes an illumination device 101 and a projection objective 102. The projection objective 102 includes a lens arrangement 103 with an aperture stop AP, wherein an optical axis OA is defined by the only schematically indicated lens arrangement 103. Between the illumination device 101 and the projection objective 102, a mask 104 is set up which is held in the light path via a mask holder 105. Masks 104 of this kind which are used in microlithography have a structure in the millimeter-to-micron range which is projected onto an image plane IP via the projection objective with a linear reduction factor of for example 4 or 5. In the image plane IP, a light-sensitive substrate 106, more specifically a wafer, is held in place which is positioned via a substrate holder 107.

The minimal size of structures that can still be resolved depends on the wavelength λ of the light being used for the illumination, and it also depends on the numerical aperture on the image side of the projection objective 102, wherein the limit of the resolution that can be achieved with the projection exposure apparatus 100 is increased with decreasing wavelength λ of the light supplied by the illumination device 101 and with increasing image-side numerical aperture of the projection objective 102.

In the scanning mode of operation, the mask or reticle 104 and the substrate 106 move in opposite directions as indicated by the arrows 108 and 109, so that a relative movement takes place in particular between the stationary projection objective 102 and the substrate 106, where the latter in the illustrated example moves laterally to the left at a substantially constant gap distance, while the mask 104 in the example moves to the right. In the coordinate system shown in the upper left of FIG. 1, the y-direction is the direction of movement of the mask which hereinafter will be referred to as scanning direction, while the z-direction represents the propagation direction of the light. To further improve the resolution, an immersion objective is used in which an immersion medium with a refractive index different from air is present between a last optical element of the projection objective and the light-sensitive substrate.

Figure 2:
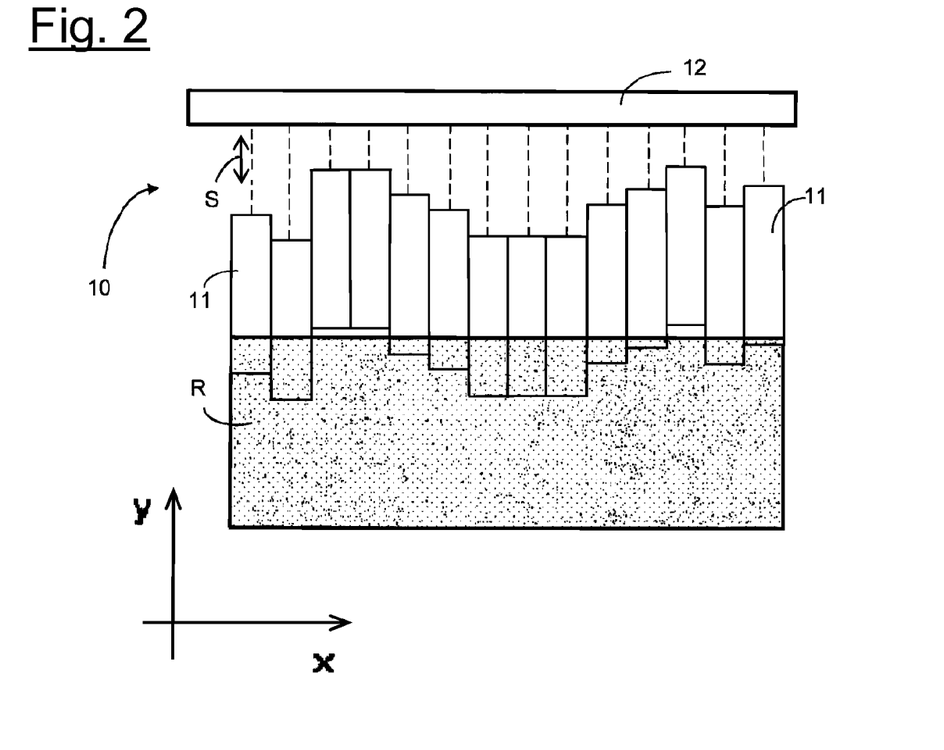
FIG. 2 shows a schematic illustration serving to explain the arrangement of a device for influencing a polarization distribution in an embodiment of the disclosure.

In a schematic representation which is not true to scale, FIG. 2 illustrates a design concept of a device 10, which serves to influence the polarization distribution. The device can be used in the illumination device 101 as well as in the projection objective 102 of the projection exposure apparatus 100 of FIG. 1.

The device 10 has a plurality of elements 11 which can be configured in the form of thin platelets of rectangular geometry, which in accordance with FIG. 1 are arranged with their lengthwise directions running parallel to each other in such a way that the long sides of neighboring elements directly adjoin each other. The elements 11 in this arrangement can be retained in a holder (not shown) which extends transverse to the lengthwise direction of the elements, in such a way that the elements can be moved in their lengthwise direction independently of each other. Optionally, at least one drive unit 12 (which is only schematically represented) or a plurality of such drive units are provided as a means of moving the elements 11 in their lengthwise direction, which drive units are operable to effect a displacement of the elements 11 which are movably seated in any practical way in the holder, with the actuating control of the elements 11 being indicated by the vertical broken lines in FIG. 2. This actuation of the elements can be performed statically as well as dynamically in the projection exposure apparatus 100 during the exposure or scanning process.

Referring to FIG. 1, device 10 can be used in the projection exposure apparatus 100 is substantially in the plane of the mask 104 or of the mask holder 105, or in a plane that is equivalent thereto, for example ahead of a reticle masking system (REMA) which is projection by a REMA objective onto the structure-carrying mask (reticle) 104. The device 10 in this application is arranged so that the lengthwise direction of the elements 11 (and thus their direction of displacement) is oriented parallel to the scanning direction (y-direction), optionally in such a way that the individual elements 11 are arranged approximately parallel to the scanning direction (y-direction), movable between a first position in which the elements 11 are located completely outside the field area of the mask 104 illuminated by the illumination device (or outside of the reticle area) which is identified in FIG. 2 by "R" and a second position in which the elements 11 cover the entire width or at least parts of the width of the illuminated field area of the mask 104 (or reticle area).

In the interest of achieving a correct image, it can be advantageous to design the arrangement of the elements 11 with symmetry relative to the center of the field. An arrangement of this kind can have two rows of elements 11 of substantially identical configuration which in accordance with FIG. 2 are arranged, respectively, above and below the illuminated field area R of the mask 104 and which can be advanced by equal amounts from above and below into the illuminated field area R.

In some embodiments, the arrangement has two rows of elements 11 that are not of the same design, which in accordance with FIG. 2 are arranged, respectively, above and below the illuminated field area R of the mask 104. The elements of the first row, for example the row above the illuminated field area R, are birefringent (optionally configured as λ/2-plates) with an orientation of the optical crystal axis at approximately 45° to the scanning direction S. The elements of the second row, for example the row below the illuminated field area R, are birefringent with an orientation of the optical crystal axis relative to the scanning direction S that is different from the orientation of the optical crystal axis of the first row (desirably approximately 0° to 90° relative to the scanning direction S).

This serves the purpose that for example a state of polarization whose direction happens to coincide with the direction of the optical crystal axis of the elements of the first row (for example at approximately 45°) and which is thus a so-called eigenstate (desired state) of these elements is not rotated by these elements. Instead, this state of polarization is rotated by the elements of the second row for which the state is not an eigenstate. Due to the additional degrees of freedom that are thereby obtained, any state of polarization can be influenced, i.e. rotated, by this kind of arrangement of birefringent elements or λ/2-plates.

Figure 3:
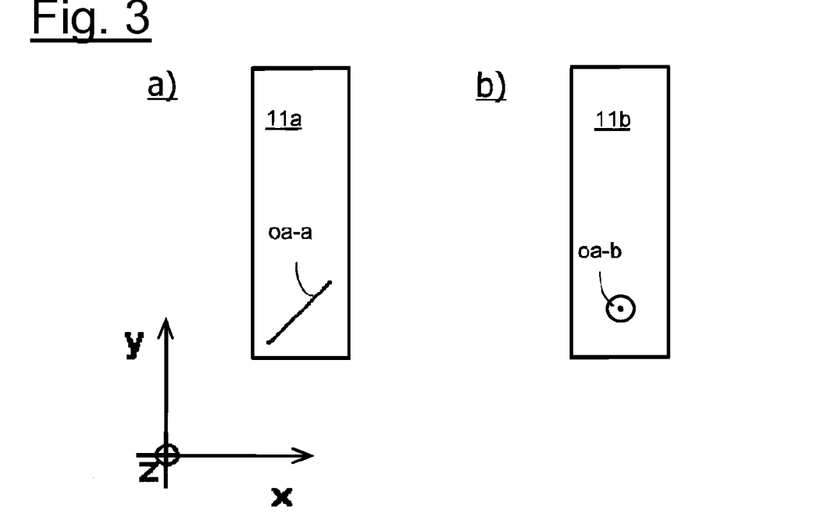
FIGS. 3a-b show schematic illustrations to explain the configurations of different design versions of polarization-influencing elements that are part of a device according to the disclosure.

Following is an explanation of the configuration of the individual elements 11 based on non-limiting examples with references to FIG. 3.

According to a first example which is illustrated only schematically in FIG. 3a, each of the elements 11a is configured as a λ/2-plate of birefringent material, for example of crystalline quartz or another birefringent material that is transparent for light of the operating wavelength being used in the apparatus. As indicated by the line "oa-a" in FIG. 3a, the optical crystal axis in the birefringent material is oriented at an angle of 45° relative to the lengthwise axis (which extends in the y-direction) of the element 11a. Since the device 10, as explained above, is installed in the projection exposure apparatus 100 with the scanning direction oriented in the lengthwise direction of the elements 11 or y-direction, the optical crystal axis oa-a in the birefringent material of the element 11a in this example is oriented at an angle of 45° relative to the scanning direction.

Each of the rod-shaped elements 11a which are configured in the form of a λ/2-plate has the property that it will cause a 90°-rotation of the preferred direction of the polarization in light of substantially linear polarization which falls on the element 11a in the z-direction and is linearly polarized in the x- or y-direction prior to its entry into the element 11a. In other words, the rod-shaped elements 11a of the device 10 influence the state of polarization of transmitted light in such a way that a certain state of polarization (in this case a linear polarization in the x- or y-direction) which exists when the light enters the element is converted to the orthogonal state of polarization relative to the state before the light entered the element.

In certain embodiments (not illustrated), each of the rod-shaped elements 11 is formed of two λ/2-plates which follow each other in the direction of light propagation (in this case the z-direction) and whose optical crystal axes are rotated relative to each other by an angle of 45°. With this arrangement, a so-called rotator unit is formed in a way that is known per se, which causes a 90°-rotation of any preferred direction of the polarization in light of substantially linear polarization (i.e., without limitation to light of linear polarization in the x- or y-direction) which falls on the element 11 in the z-direction. However, this design of the rod-shaped element 11 entails that the individual elements have to be made in a more expensive configuration where each element is composed of two λ/2-plates, a drawback that can be avoided in the previously described embodiments with two rows of elements.

According to a further example which is illustrated in FIG. 3b, each of the elements 11b is made of an optically active material which is transparent for light of the operating wavelength being used in the apparatus, for example of optically active quartz. As indicated in FIG. 3b, the optical crystal axis oa-b in an element 11b of this example is oriented perpendicular to the surface, i.e. parallel to the surface-normal vector of the element 11b (which is represented as the negative z-direction in FIG. 3b). Thus, the device 10 is installed in the projection exposure apparatus 100 with the optical crystal axis oa-b in the optically active crystal material of the element 11b oriented parallel to the direction of incidence in which the light emitted by the illumination device falls on the optical element 11b.

Due to their configuration, the elements 11b in FIG. 3b exhibit only circular birefringence with perpendicular incidence of the light, and no linear birefringence. The thickness of the rod-shaped elements 11b in such embodiments is selected so that the orientation of the preferred direction of the polarization of the light is rotated by 90° for light that traverses an element 11b in the direction perpendicular to the element. When using synthetic optically active crystalline quartz with a specific rotating power α of about 323.1°/mm at a wavelength of 193 nm and at a temperature of 21.6° C., meeting the condition of a 90°-rotation requires a thickness of the elements 11b of d≈278.55 μm. Of course, an equivalent effect, i.e. a rotation of the preferred direction of polarization into a direction perpendicular to the original preferred direction of polarization, can also be achieved if the elements 11b cause a rotation of the preferred direction of polarization by 90°±n*180° (wherein n is an integer ≧0).

Thus, the elements 11b of the device, likewise, influence the state of polarization for transmitted light in such a way that a given state of polarization that exists before the light enters the element is converted to a polarization that is orthogonal to the state before entering the element. Embodiments according to FIG. 3b can have the further advantage over embodiments of FIG. 3a that they also provide the capability for a controlled change of other polarization distributions. For example, tangentially polarized light (in which the planes of oscillation of the E-field vectors of the individual linearly polarized light rays are approximately perpendicular to the radius originating from the optical axis) is converted into radially polarized light (in which the planes of oscillation of the E-field vectors of the individual linearly polarized light rays have an approximately radial orientation relative to the optical axis) and vice versa.

Of course, it is not necessary for all elements of the device 10 to have the same design. It is also possible that some of the elements 11 are of a design as described in the context of FIG. 3a and other elements 11 are of a design as described in the context of FIG. 3b. In some embodiments, the elements 11 can also be configured as dielectric coating layers, or each element 11 can be configured as a combination of one or several birefringent crystals with one or more birefringent dielectric coating layers.

The elements 11 can further have a transparent substrate which does not influence the polarization, to which substrate a birefringent plate or layer is connected by wringing or otherwise added.

Figure 6:
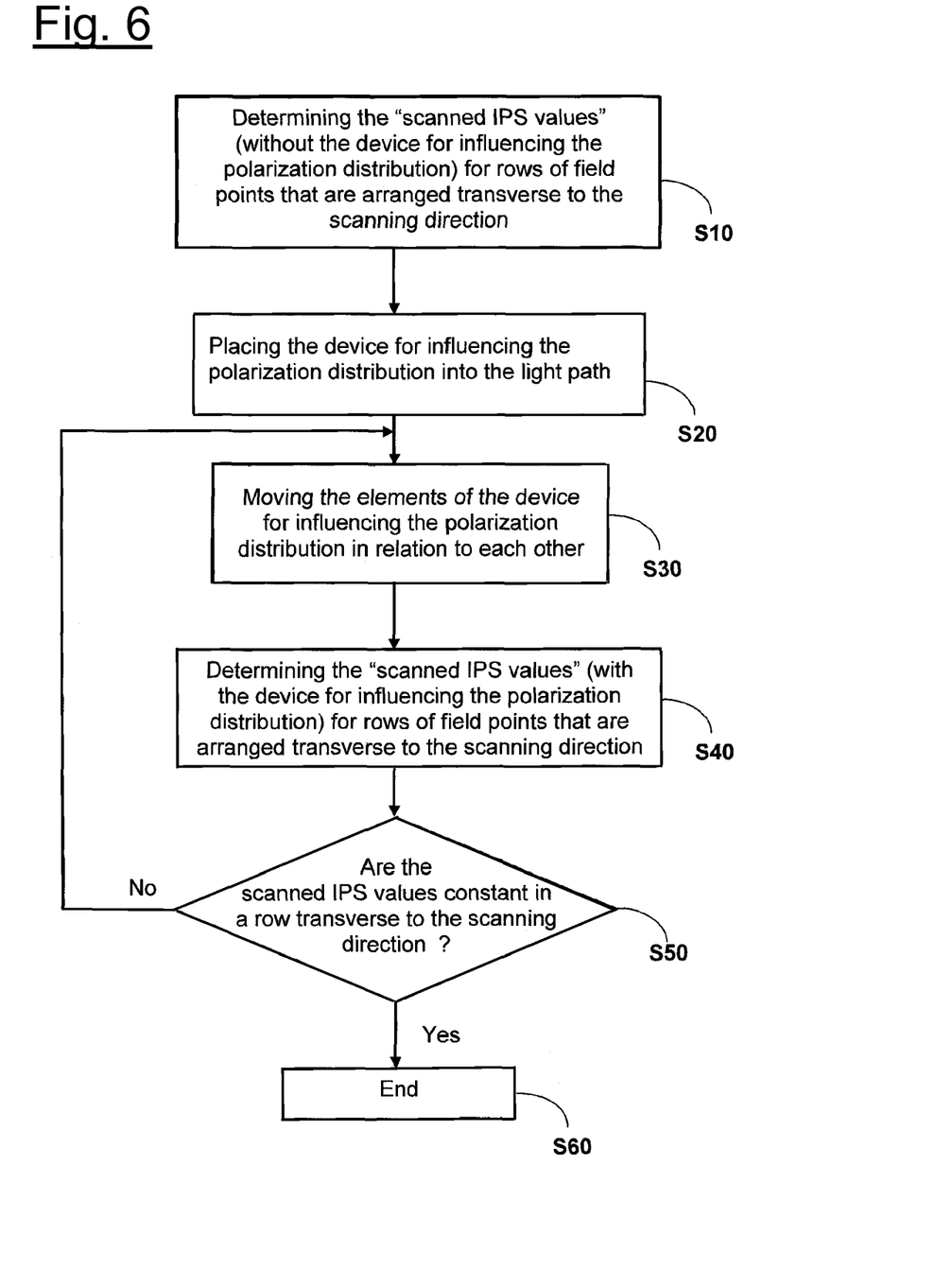
FIG. 6 represents a flowchart to explain a method of influencing the polarization distribution according to an embodiment of the disclosure.

Following is an explanation how the device according to the disclosure is used to set a more uniform polarization distribution in the projection exposure apparatus 100. In this regard, the flowchart diagram of FIG. 6 is referred to, which represents an example of a method according to the disclosure for influencing the polarization distribution.

For a quantitative characterization of the polarization distribution one uses furthermore the so-called IPS value which represents a measure of the presence of a specific (desired) orientation of the polarization at a specific location (IPS stands for "Intensity in Preferred State"). Generally, the IPS value is determined at a specific given location (such as in particular a given field point in the reticle plane) through the following steps:

(a) measuring the intensity $I_1$ of the light which passes through an ideal polarizer that is arranged in the given plane and has a transmissivity of T=1 in the transmitted direction and T=0 in the blocked-off direction, wherein the polarizer is arranged so that its transmitting direction is parallel to the "desired" orientation of the polarization (i.e. for example parallel to the grid lines in the mask structure), in other words parallel to the direction for which the IPS value is taken to indicate the relative proportion of the polarization that conforms to this orientation;

(b) removing the ideal polarizer from the ray path and measuring the (total) light intensity $I_{tot}$ at the same field point; and (c) calculating the IPS value as the ratio $I_1/I_{tot}$ (with $0 \leq IPS \leq 1$).

The given direction in step (a) is the desired direction for which the IPS value indicates the relative proportion of the polarization that conforms to this direction. As a rule, this is the direction parallel to the lengthwise direction of the grid structures on the reticle of which an image is to be produced.

According to FIG. 6, a first step S10 of the method according to the disclosure consists of determining the polarization distribution in the reticle field of the projection exposure apparatus 100 without the device 10 being used in the projection exposure apparatus 100.

This is accomplished by performing the foregoing steps (a)-(c) for the determination of an IPS value for a number of field points that are arranged transverse to the scanning direction (i.e. for different x-coordinates) repeatedly during the scanning process, so that after the IPS values obtained for one x-coordinate have been averaged, one obtains a mean IPS value associated with that x-coordinate (as a result of averaging over the scan direction), which is referred to as a so-called scanned IPS value.

Figure 4:
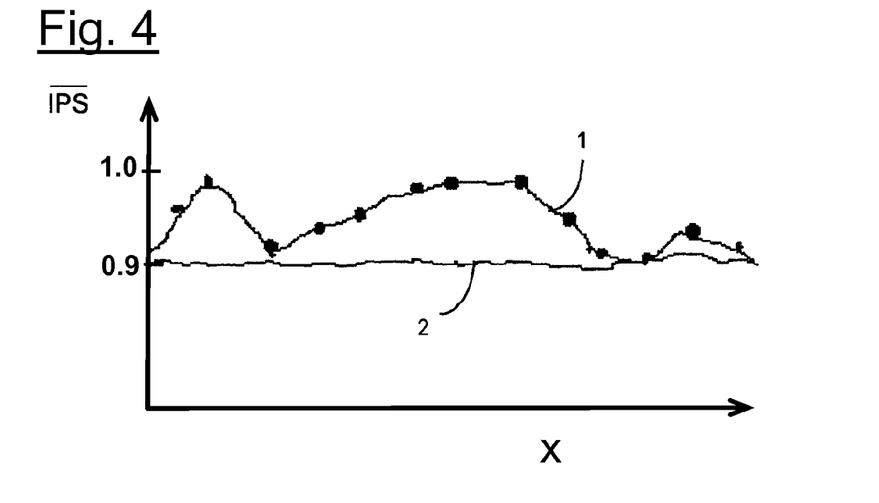
FIG. 4 represents a diagram of a typical polarization distribution in a reticle plane of a projection exposure apparatus without (graph 1) and with (graph 2) a device for influencing the polarization distribution that is used according to the disclosure and appropriately adjusted.

An example of a graph that has been obtained through this procedure is identified by the reference symbol "1" in the diagram of FIG. 4. As can be seen in FIG. 4, the minimum of the scanned IPS values is 0.9 in this example (i.e. proportion of the light for which the polarization is oriented in the desired or given direction is 90% of the total light intensity for that x-coordinate when the average over the scan direction is taken).

In a next step S20, the device 10 is set into the light path of the projection exposure apparatus 100, optionally at a location in the proximity of the reticle field plane. The distance between the device 10 and the reticle field plane is optionally selected so that a defocusing that occurs due to this distance at the location of the device 10 is sufficient in order to blur the border areas between two rod-shaped elements 11 of the device 10.

In a further step S30 (which can be performed either before or after step S20), the individual elements 11 in the device 10 which are slidable relative to each other are adjusted by moving individual elements 11 in relation to the others so that those elements 11 which in the installed position are located at the x-coordinates with the maximum IPS value are moved the farthest into the reticle field, while those elements 11 which in the installed position are located at the x-coordinates with the minimum IPS value, are advanced the least or not at all into the reticle field. In other words, the individual elements 11 are advanced independently of each other into the reticle field by a distance that is commensurately larger, the larger the IPS value is that has been found for the x-coordinate associated with this element.

The objective in making this adjustment of the elements 11 is to obtain a profile of the mean IPS values over the scanning direction (i.e. of the scanned IPS values) that is as constant as possible over the x-coordinate, as illustrated by the graph 2 in FIG. 4. According to the disclosure, one can use the procedure of first calculating a target position based on the scanned IPS values that were determined in step S10 and bringing the elements already directly into the target position, i.e. moving them independently of each other. It is further possible to perform the steps for adjusting the elements 11 and registering the scanned IPS values repeatedly for an iterative determination of the ideal displacement distance for each of the elements, as represented in the steps S40, S50 and S60 in the flowchart diagram of FIG. 6.

As can be seen from the graph 2 in FIG. 4, the absolute amounts of the scanned IPS values after adjusting the elements 11 to their optimal position are equal to the minimum of the scanned IPS values that were found in step S10 (before the device 10 was used), and the scanned IPS values are substantially constant over the x-coordinate in the reticle field, as reflected in the graph 2.

Figure 5:
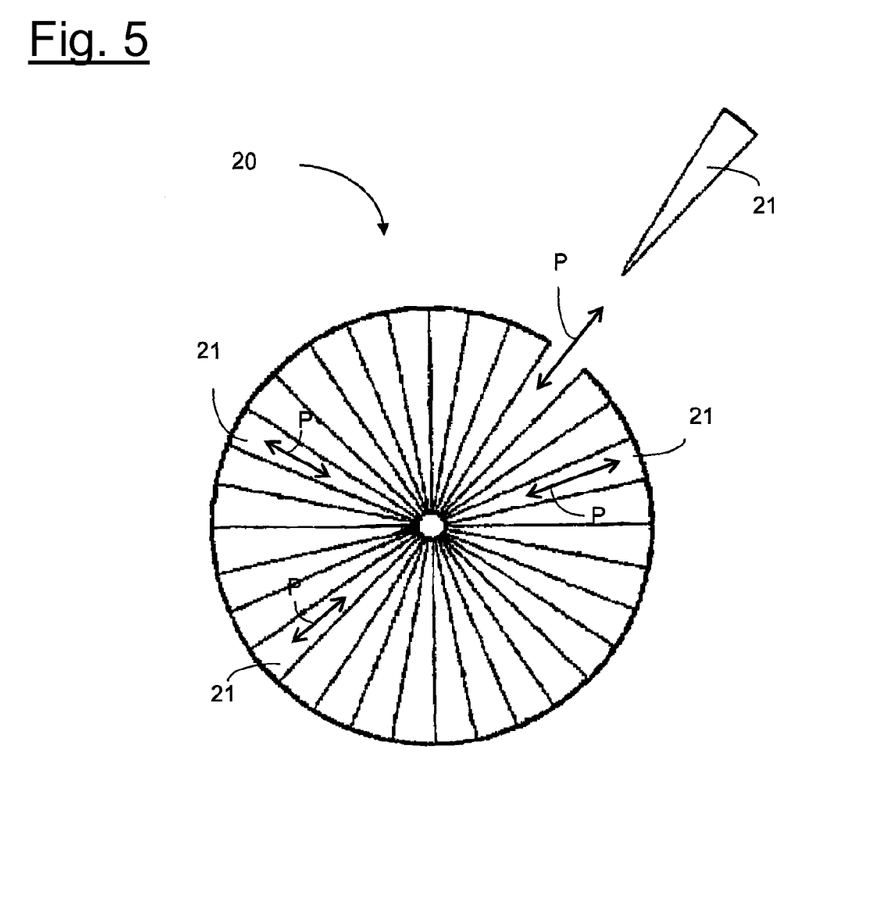
FIG. 5 represents a schematic illustration to explain the configuration of a device for influencing a polarization distribution according to an embodiment of the disclosure.

FIG. 5 gives a schematic representation (which is not true to scale) to explain the design of a device 20 according to the disclosure for influencing the polarization distribution in certain embodiments. Like the device 10, the device 20 has a plurality of polarization-influencing elements 21 which are optionally configured in the form of thin platelets, which are arranged so that they can be moved independently of each other, analogous to the device 10 of FIG. 2. The holder and the actuation control of the individual elements 21 can be configured analogous to the device 10 in any desired way that is suitable for the purpose. However, unlike in the device 10 of FIG. 2, the elements 21 of the device 20 are not arranged with a common direction of displacement, but are arranged to move in the radial direction relative to a common central axis, as indicated by the double arrows "P" in FIG. 5 for an element 21 which has been moved only for the purpose of giving an example. According to FIG. 5, each of the elements 21 is shaped substantially like a sector of a circle, with the individual elements 21 bordering directly on each other in the tangential direction. In all other respects, what was the above about possible configurations of the polarization-influencing elements 11, in particular with regard to the materials used to manufacture the elements, their polarization-influencing effect, etc., is analogously applicable to the polarization-influencing elements 21.

The device 20 is particularly well suited for influencing the polarization distribution in a plane of an illumination device that is close to a pupil, perpendicular to the optical axis or to the direction of light propagation, and this again applies when used in conjunction with a dipole illumination, quadrupole illumination, or an annular illumination, in which case a local manipulation of the state of polarization is achieved by moving the individual optical elements 21 by different amounts into the pupil or into the illuminated area of the plane close to the pupil. If for example an individual area of the given illumination arrangement, such as in particular one of the four poles of a quadrupole arrangement, has on average a 5% higher IPS value over this pole than over the other poles, one can advance one or more of the polarization-influencing elements 21 in the area of this pole by an appropriate distance in the radial direction and thereby achieve that the preferred direction of the polarization of the transmitted light is rotated by optionally 90° in a defined area that is covered by the moved elements, so that the IPS value is lowered. If the IPS value in the pole in the aforementioned example is lowered by 5%, the desired uniform polarization distribution as an average over the poles will be obtained as a result.

Even though the disclosure has been described through the presentation of specific embodiments, those skilled in the pertinent art will recognize numerous possibilities for variations and alternative embodiments, for example by combining and/or exchanging features of individual embodiments. Accordingly, it will be understood that such variations and alternative embodiments are considered as being included in the present disclosure and that the scope of the disclosure is limited only by the attached patent claims and their equivalents.

The invention claimed is:

1. A device, comprising:
a plurality of optical elements arranged in a common plane and movable independently of each other,
wherein:
each of the optical elements is capable of converting a state of polarization of incoming light on the optical element into another state of polarization;
the optical elements are movable independently of each other in respective directions that are radial relative to a common axis; and
the device is configured to be capable of influencing a polarization distribution in a microlithographic projection exposure apparatus when the device is used in the microlithographic projection exposure apparatus.

2. The device according to claim 1, wherein at least one of the optical elements can cause a rotation of a direction of polarization of incoming light on the optical element.

3. The device according to claim 1, wherein at least one of the optical elements can cause a rotation of a direction of polarization of incoming light on the optical element by $90°\pm n*180°$ (wherein n is an integer number $\geqq 0$), where the incoming light is of substantially linear polarization at an operating wavelength of the device.

4. The device according to claim 1, wherein at least one of the optical elements comprises an optically active crystal material which has an optical crystal axis oriented substantially parallel to a direction of propagation of incoming light on the at least one of the optical elements.

5. The device according to claim 4, wherein the optically active crystal material is crystalline quartz, $TeO_2$, or $AgGaS_2$.

6. The device according to claim 1, wherein at least one of the optical elements comprises a birefringent crystal material.

7. The device according to claim 6, wherein the at least one of the optical elements is a λ/2-plate.

8. The device according to claim 1, wherein at least one of the optical elements comprises a birefringent dielectric coating or a combination of a birefringent dielectric coating and a birefringent crystal material.

9. The device according to claim 1, wherein at least one of the optical elements comprises:
a substrate that is transparent for transmitted light at an operating wavelength of the device and that does not influence the polarization of the incoming light; and
a birefringent plate or birefringent dielectric coating arranged on the substrate.

10. The device according to claim 1, wherein at least some of the optical elements are arranged so that they directly adjoin each other in a tangential direction relative to a common axis.

11. The device according to claim 1, wherein at least some of the optical elements have a geometrical shape that is substantially a sector of a circle.

12. The device according to claim 1, wherein at least one of the optical elements is, in at least one location, provided with an antireflection coating.

13. The device according to claim 1, wherein at least one of the optical elements has a thickness that amounts to not more than 15% of their average width.

14. The device according to claim 1, wherein at least one of the optical elements has peripheral faces that are, in at least one location, provided with a coating being absorbent for light of an operating wavelength of the device.

15. An apparatus, comprising:
a projection objective configured to project an image of an object field into an image field in an area, the area being movable in a first direction relative to the projection objective; and
a device according claim 1,
wherein the apparatus is a microlithographic projection exposure apparatus.

16. The apparatus according to claim 15, wherein the plurality of optical elements of the device are arranged in such a way that they are movable independently of each other in a common direction of advancement that is substantially parallel to the first direction.

17. The apparatus according to claim 15, wherein the device is arranged at least in direct proximity to a field plane.

18. The apparatus according to claim 15, wherein at least one of the optical elements is movable between a first position in which the at least one optical element is located completely outside of an illuminated field area of the microlithographic projection exposure apparatus, and a second position in which the at least one optical element extends in at least some of the illuminated field area of the microlithographic projection exposure apparatus.

19. The apparatus according to claim 15, wherein the apparatus comprises at least two devices according to claim 1, the optical elements of the at least two devices being arranged in a common plane that extends perpendicular to a direction of propagation incoming light on the optical elements.

20. The apparatus according to claim 19, wherein at least some of the optical elements of the at least two devices are arranged in pairs so that the optical elements of each pair can be moved from opposite sides into an illuminated field area.

21. The apparatus according to claim 19, wherein the optical elements of the at least two devices are identical to each other in their design.

22. The apparatus according to claim 19, wherein at least one of the optical elements of one of the at least two devices is not of an identical design as the polarization-influencing optical elements of the other one of the at least two devices.

23. The apparatus according to claim 22, wherein at least one of the optical elements of one of the at least two optical devices comprises a birefringent material with an orientation of its optical crystal axis at an angle of substantially 45° relative to the first direction, and wherein at least one of the optical elements of the other one of the at least two devices comprises a birefringent material with an orientation of its optical crystal axis at an angle of substantially 0° or substantially 90° relative to the first direction.

24. The apparatus according to claim 15, wherein:
the plurality of optical elements are arranged in a subsystem of the microlithography projection exposure apparatus;
the subsystem has an optical axis;
the subsystem is an illumination device or a projection objective; and
the optical elements of the device are arranged so that they can be moved independently of each other in a radial direction relative to the optical axis of the subsystem.

25. The apparatus according to claim 24, wherein the device is arranged at least in immediate proximity to a pupil plane of the microlithography projection exposure apparatus.

26. The apparatus according to claim 15, wherein the plurality of optical elements of the device are arranged so that, after performing a scan-integration in the microlithographic exposure apparatus in a scan direction, a substantially constant polarization distribution is obtained in the direction perpendicular to the scan direction.

27. The apparatus according to claim 15, further comprising a second device, the second device being configured to compensate a modification of an intensity distribution caused by the first device.

28. The apparatus according to claim 27, wherein the second device comprises a plurality of light-blocking elements that can be moved in a common plane independently of each other, the plurality of light-blocking elements being at least in some parts partially transmissive or opaque to light of an operating wavelength.

29. A device, comprising:
a plurality of optical elements arranged in a common plane and movable independently of each other,
wherein:
each of the optical elements is capable of converting a state of polarization of incoming light on the optical element into another state of polarization;
at least one of the optical elements has a thickness that amounts to not more than 15% of their average width; and
the device is configured to be capable of influencing a polarization distribution in a microlithographic projection exposure apparatus when the device is used in the microlithographic projection exposure apparatus.

30. An apparatus, comprising:
a projection objective configured to project an image of an object field into an image field in an area, the area being movable in a first direction relative to the projection objective;
a first device comprising a first plurality of optical elements arranged in a plane, the first plurality of optical elements being movable independently of each other; and
a second device comprising a second plurality of optical elements arranged in the plane and movable independently of each other,
wherein:
for each of the optical elements of the first and second pluralities of optical elements, the optical element is capable of converting a state of polarization of incoming light on the optical element into another state of polarization;
the plane extends perpendicular to a propagation direction of light incident on the optical elements during use of the apparatus, and
the apparatus is a microlithographic projection exposure apparatus.

* * * * *

UNITED STATES PATENT AND TRADEMARK OFFICE
CERTIFICATE OF CORRECTION

PATENT NO. : 8,077,289 B2
APPLICATION NO. : 12/052507
DATED : December 13, 2011
INVENTOR(S) : Damian Fiolka It is certified that error appears in the above-identified patent and that said Letters Patent is hereby corrected as shown below:

Column 2,
Line 23, after "light" insert --.--

Column 4,
Line 8, after "zero)" insert --.--

Column 6,
Line 9, delete "that that" and insert --that--

Column 13,
Line 24, after "according" insert --to--

Signed and Sealed this
First Day of May, 2012

David J. Kappos
*Director of the United States Patent and Trademark Office*